United States Patent
Kwasnick et al.

(10) Patent No.: US 6,822,256 B2
(45) Date of Patent: Nov. 23, 2004

(54) FORMING ORGANIC LIGHT EMITTING DEVICE DISPLAYS

(75) Inventors: Robert F. Kwasnick, Palo Alto, CA (US); Mary E. Swallow, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 439 days.

(21) Appl. No.: 09/954,882

(22) Filed: Sep. 18, 2001

(65) Prior Publication Data

US 2003/0052327 A1 Mar. 20, 2003

(51) Int. Cl.⁷ .................................................. H01L 33/00
(52) U.S. Cl. ........................ 257/40; 257/759; 257/760; 438/99
(58) Field of Search ........................... 257/40, 759, 760; 438/99

(56) References Cited

U.S. PATENT DOCUMENTS

| | | | | |
|---|---|---|---|---|
| 4,618,878 A | * | 10/1986 | Aoyama et al. | ............... 357/71 |
| 5,189,502 A | * | 2/1993 | Gomi | ........................... 257/759 |
| 5,233,181 A | * | 8/1993 | Kwansnick et al. | ...... 250/208.1 |
| 5,288,989 A | * | 2/1994 | Ishaque et al. | .......... 250/214.1 |
| 5,703,436 A | * | 12/1997 | Forrest et al. | ............... 313/506 |
| 6,370,019 B1 | * | 4/2002 | Matthies et al. | ............ 361/681 |
| 6,404,126 B1 | * | 6/2002 | Arai et al. | ................... 313/503 |

FOREIGN PATENT DOCUMENTS

| | | | | |
|---|---|---|---|---|
| JP | 7-153575 | * | 6/1995 | ........... H05B/33/26 |
| JP | 9-82476 | * | 3/1997 | ........... H05B/33/26 |

* cited by examiner

*Primary Examiner*—Bradley Baumeister
(74) *Attorney, Agent, or Firm*—Trop, Pruner & Hu, P.C.

(57) ABSTRACT

An organic light emitting device display may be formed that is suitably passivated while still permitting electrical access to cathodes and anodes via electrical contacts. In one embodiment, a barrier layer may be formed over the light emitting material to prevent moisture or other ambient attack. The barrier layer may be covered with other layers to form an outer and inner via down to the cathode or anode to be contacted. A contact metal may be provided to the anode or cathode. The layers over the barrier layer permit patterning and contact formation while the barrier layer adequately protects the light emitting material during those steps and thereafter.

25 Claims, 2 Drawing Sheets

FORMING ORGANIC LIGHT EMITTING DEVICE DISPLAYS

BACKGROUND

This invention relates generally to organic light emitting device (OLED) displays. OLED displays may use conjugated polymers or small molecules that actually emit light.

Organic light emitting device displays offer the potential for displays that may be manufacturable at relatively low cost. One issue with OLED materials, however, is that they are relatively sensitive to ambient conditions and especially to moisture.

While it has been suggested that the OLED materials may be passivated to protect them from moisture attack, such passivation generally interferes with the manufacture of contacts used to drive the OLED materials to emit light. In some situations, the contacts can be formed around the periphery of the display. But in many situations, such as with tiled or array displays, it is not possible to situate the contacts around the periphery. Instead, the contacts must be made directly into the light producing areas of the OLED display.

Thus, there is a need for a technique for manufacturing OLED displays that protects the OLED material from moisture and other ambient conditions while still facilitating the making of electrical contacts in the actual active display area.

DETAILED DESCRIPTION

Figure 1:
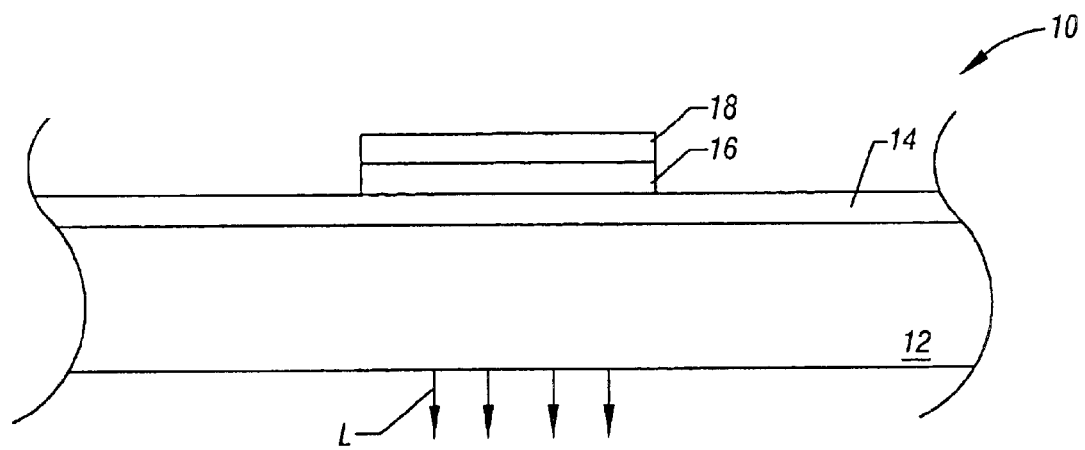
FIG. 1 is an enlarged side elevational view in accordance with one embodiment of the present invention.
Figure 2:
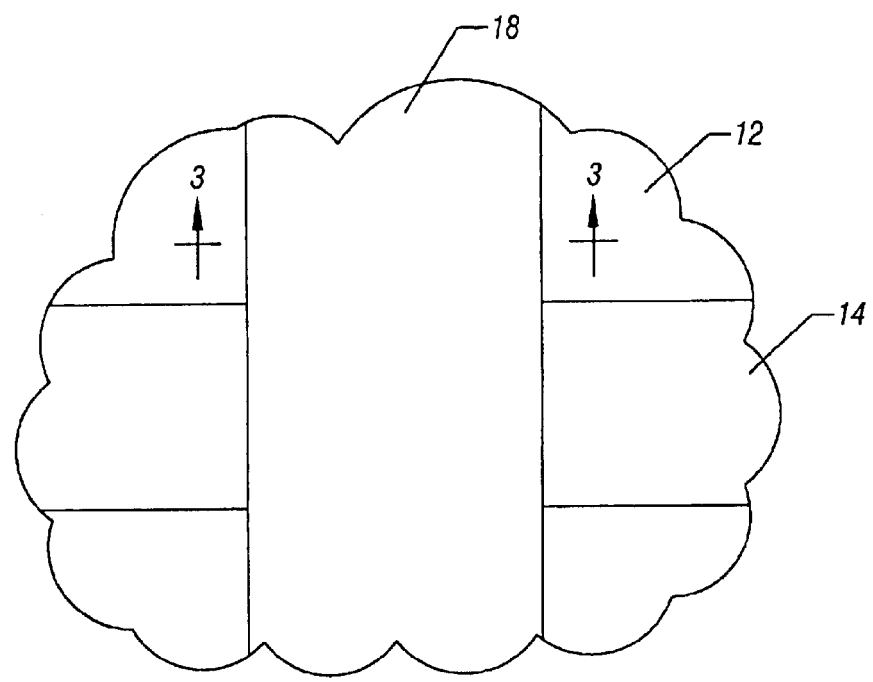
FIG. 2 is a top plan view of the embodiment shown in FIG. 2.

Referring to FIG. 1, in accordance with one embodiment of the present invention, a pixel of an organic light emitting device (OLED) display 10 may be formed on a substrate 12. In one embodiment, the substrate 12 is transparent or substantially transparent. For example, the substrate 12 may be formed of glass. A row or anode 14 extends across the substrate 12. In one embodiment, the row or anode 14 may be made of a transparent material such as indium tin oxide (ITO). An organic light emitting material 16 may be formed on the anode 14. The material 16 may comprise one or more layers. Thereafter, a column or cathode 18 may be formed so as to extend generally transversely to the row or anode 14 as better shown in FIG. 2.

The display 10 may be coupled to a back panel that may provide interconnections to receive signals to drive light emitting materials 16. Thus a plurality of pixels may be produced that generate an overall displayed image. In one embodiment, the front and back panels may be coupled by using surface mount techniques to both physically and electrically couple the front end back panels.

When a potential is applied between the anode 14 and cathode 18, current flow results in the generation of light indicated as L in FIG. 1. More particularly, the light emission from the light emitting material 16 passes through the substantially transparent row or anode 14 and the substrate 12 and out of the display 10.

In some embodiments, a plurality of light emitting materials may be stacked one on top of the other to produce a desired color. In other embodiments, pixels may be put side-by-side to develop a tri-color color space for display purposes. The embodiment shown in FIG. 1 corresponds to the side-by-side type of OLED display.

Figure 3:
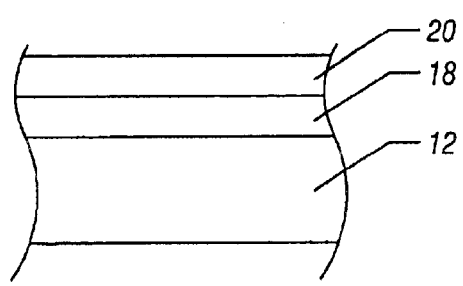
FIG. 3 is an enlarged cross-sectional view taken generally along the line 3—3 in FIG. 2.

Turning now to FIG. 3, the fabrication of the display 10, in one embodiment, begins by formation over the substrate 12 and material 16 of a cathode or column 18. A barrier material 20 may be deposited uniformly over the combination of the substrate 12 and cathode 18. The barrier layer 20 is typically from 0.1 to 2 microns thick and most advantageously from 0.5 to 1 microns thick. It may comprise a plasma-enhanced chemical vapor deposited (PECVD) or sputtered silicon nitride or silicon oxide in one embodiment. However, other barrier materials 20 may be utilized that are insulating so as not to short the cathodes 18. Furthermore, if the layer 20 is substantially transparent, the OLED light emission may be upwardly directed (instead of being downwardly directed as illustrated in FIG. 1) through the layer 20 in some embodiments.

Figure 4:
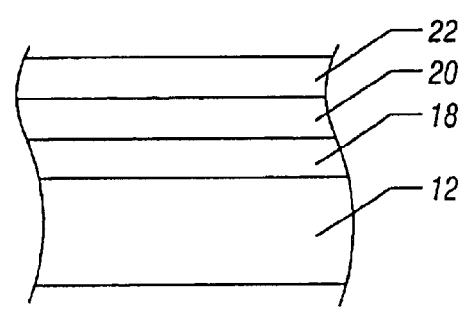
FIG. 4 is a cross-sectional view corresponding to FIG. 3 at a subsequent stage of manufacturing in accordance with one embodiment of the present invention.

Moving to FIG. 4, an organic layer 22 is deposited atop the barrier layer 20. The organic layer 22 forms a more planarized structure over the underlying layers. In addition, the organic layer 22 provides a substantially pinhole-free layer as a surface on which subsequent layers are deposited. The organic layer 22 may be from 0.2 to 2.0 microns and most advantageously from about 0.5 to 1.0 microns in some embodiments. The organic layer 22 may be deposited as a vapor, a spray (such as an atomized spray) or a liquid (for example, a coating that is spun on the barrier layer 20). The organic layer 22 may comprise material such as acrylics, photoresists and pre-imidized polyimides.

The temperature of organic layer 22 deposition and cure in cross-linking post-deposition may be limited in some embodiments by the sensitivity of the OLED material 16 to higher temperature. Typically, OLED material 16 has a glass transition temperature and it is desirable not to exceed about that temperature during deposition of other layers. Thus, in some embodiments, the maximum temperature for deposition and subsequent curing or cross-linking of the organic layer 22 is about 140° C. in some embodiments.

The barrier layer 20 protects the underlying OLED material 16 from possible interaction with the organic layer 22.

Figure 5:
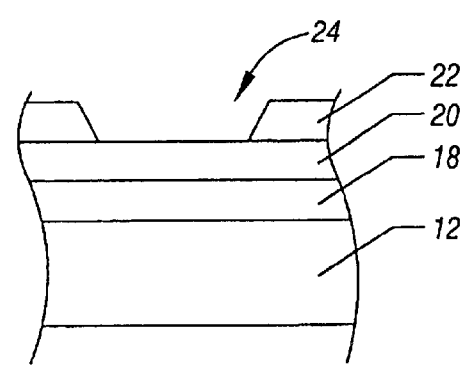
FIG. 5 is a cross-sectional view corresponding to FIG. 4 at a subsequent stage of manufacturing in accordance with one embodiment of the present invention.

As shown in FIG. 5, the organic layer 22 is then patterned to form the outer via 24. The dimensions of the outer via 24 are typically smaller than the width of the cathode 18 so as not to overlap the cathode edges due to misalignment or overetch. This patterning of the organic layer 22 may employ photoresist patterning followed by wet or dry etching, followed by photoresist stripping in one embodiment. Alternatively, the organic layer 22 may be itself photopatternable.

The photoresist post-bake, if applicable, is advantageously done at a temperature below that which would result in damage to the OLED material 16. For example, post-bake temperatures of 120° C. and below may be employed. Again, the barrier layer 20 protects the OLED material 16 from the photoresist stripping process that may involve water or solvent-based chemicals (that would otherwise diffuse through the organic layer 22 and damage the OLED material 16 but for the presence of the barrier layer 20). The outer via 24 may be sloped as a byproduct of the etch process to improve the step coverage of subsequent layers.

Figure 6:
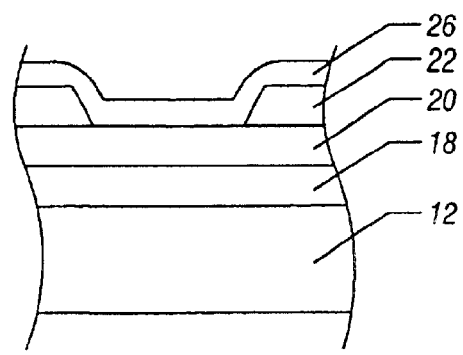
FIG. 6 is a cross-sectional view corresponding to FIG. 5 at a subsequent stage of manufacturing in accordance with one embodiment of the present invention.

Referring next to FIG. 6, a passivation layer 26 may be deposited on the organic layer 22 as patterned. The thicknesses and materials utilized for the passivation layer 26 may be similar to, if not identical, to those utilized for the barrier layer 20 in some embodiments.

Figure 7:
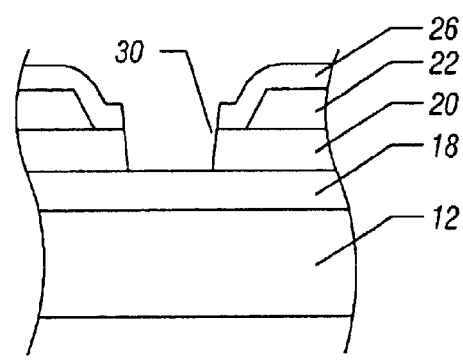
FIG. 7 is a cross-sectional view corresponding to FIG. 6 at a subsequent stage of manufacturing in accordance with one embodiment of the present invention.

Next, as shown in FIG. 7, the passivation layer 26 and barrier layer 20 are patterned with the same photolithographic mask, for example by a wet etch, and then the resist is removed. The mask may form the inner via 30 that lies within the outer via 24. The inner via 30 dimensions may be smaller than the outer via dimensions in one embodiment so that the vias 24 and 30 remain nested after the patterning processing is completed. The inner via 30 sidewall may be sloped to enhance step coverage of subsequent layers. The passivation and barrier layers 26 and 20 protect the underlying organic materials from degradation or moisture absorption.

Figure 8:
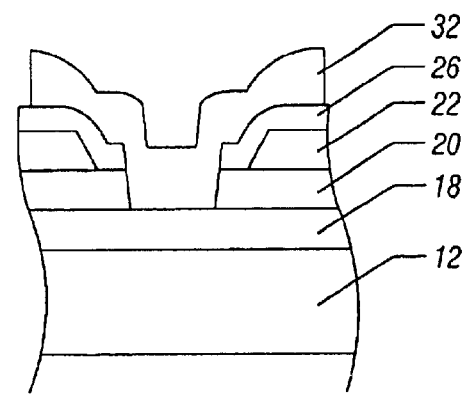
FIG. 8 is a cross-sectional view corresponding to FIG. 7 at a subsequent stage of manufacturing in accordance with one embodiment to the present invention.

Finally, referring to FIG. 8, a contact 32 may be formed over the inner via 30 and outer via 24 to the column 18. The contact 32 extends past the edge of the outer via 30 to enhance electrical contact to overlying conducting materials. Again, standard photolithographic techniques may be employed. The contact 32 may be 0.5 to 4 microns thick in one embodiment and may comprise a metal such as titanium, gold, aluminum, silver or any other conductive materials in some embodiments. The same techniques may be used to contact the rows 14.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming an organic light emitting material on a substrate;
   covering said material with a first inorganic layer that reduces moisture access to said material;
   covering said first inorganic layer with an organic layer;
   covering said organic layer with a second inorganic layer; and
   forming a contact through said first and second inorganic and organic layers.

2. The method of claim 1 further including patterning said organic layer to form an outer via.

3. The method of claim 2 further including forming an inner via through said second inorganic layer and said first inorganic layer.

4. The method of claim 3 including forming said inner via within said outer via.

5. The method of claim 3 including forming said outer via with sloping side walls.

6. The method of claim 3 including forming an electrode on said substrate under said first inorganic layer and forming said outer via with a width smaller than the width of said electrode.

7. The method of claim 1 including forming a first electrode on said substrate, forming said organic light emitting material over said first electrode, and forming a second electrode over said organic light emitting material.

8. The method of claim 1 including depositing a first inorganic layer that is substantially light transparent.

9. The method of claim 1 including depositing said organic layer to planarize the substrate.

10. The method of claim 1 including covering said material with a first inorganic layer and covering said first inorganic layer with an organic layer at a temperature below the glass transition temperature of said light emitting material.

11. An organic light emitting device display comprising:
    a support structure;
    an organic light emitting material deposited on said support structure;
    a pair of electrodes on said support structure sandwiching said light emitting material;
    a first inorganic layer covering said electrodes to reduce moisture access to said light emitting material;
    an organic layer over said first inorganic; and
    a second inorganic layer covering said organic layer.

12. The display of claim 11 including a contact formed to one of said electrodes through said first and second inorganic and organic layers.

13. The display of claim 11 including an outer via formed through said organic layer.

14. The method of claim 13 including an inner via formed through said first and second inorganic layers.

15. The display of claim 14 wherein said inner via is formed within said outer via.

16. The display of claim 13 wherein said outer via has sloping walls.

17. The display of claim 13 wherein said outer via has a width smaller than the width of one of said electrodes.

18. The display of claim 11 wherein said first inorganic layer is substantially light transparent.

19. The display of claim 11 including an outer via formed through said organic layer.

20. An organic light emitting device display comprising:
    a support structure;
    an organic light emitting material deposited on said support structure;
    a pair of electrodes on said support structure sandwiching said light emitting material;
    a first inorganic layer covering said electrodes;
    an organic layer over said first inorganic layer;
    a second inorganic layer over said organic layer; and
    a contact formed to one of said electrodes through said first and second inorganic and organic layers.

21. The display of claim 20 including an outer via formed through said organic layer.

22. The display of claim 21 including an inner via formed through said first and second inorganic layers.

23. The display of claim 22 wherein said inner via is formed within said outer via.

24. The display of claim 22 wherein said outer via has sloping walls.

25. The display of claim 21 wherein said first inorganic layer is substantially light transparent.

* * * * *